(12) United States Patent
Jamar et al.

(10) Patent No.: US 8,836,916 B2
(45) Date of Patent: Sep. 16, 2014

(54) ILLUMINATION SYSTEM FOR USE IN A STEREOLITHOGRAPHY APPARATUS

(75) Inventors: Jacobus Hubertus Theodoor Jamar, Vessem (NL); Andries Rijfers, Kamerik (NL); Borgert Kruizinga, Zoetermeer (NL); Jentske D. Kooistra, Delft (NL); Mark Herman Else Vaes, Eindhoven (NL)

(73) Assignees: Nederlandse Organisatie voor toegepast-natuurwetenschappelijk Onderzoek TNO, Delft (NL); DSM IP Assets B.V., Heerlen (NL)

( * ) Notice: Subject to any disclaimer, the term of this patent is extended or adjusted under 35 U.S.C. 154(b) by 428 days.

(21) Appl. No.: 13/254,612

(22) PCT Filed: Mar. 8, 2010

(86) PCT No.: PCT/NL2010/050116
§ 371 (c)(1),
(2), (4) Date: Nov. 17, 2011

(87) PCT Pub. No.: WO2010/101466
PCT Pub. Date: Sep. 10, 2010

(65) Prior Publication Data
US 2012/0057143 A1    Mar. 8, 2012

(30) Foreign Application Priority Data
Mar. 6, 2009 (EP) .................. 09154568

(51) Int. Cl.
*G03B 27/54* (2006.01)
*G03B 27/42* (2006.01)
*B29C 67/00* (2006.01)
*G03F 7/20* (2006.01)

(52) U.S. Cl.
CPC ........ *G03F 7/70416* (2013.01); *B29C 67/0085* (2013.01); *B29C 67/0066* (2013.01); *G03F 7/70391* (2013.01)
USPC ............................................. 355/67; 355/53

(58) Field of Classification Search
CPC .......... G03B 7/70391; G03B 7/70416; B29C 67/0066; B29C 67/0062; B29C 67/0085
USPC .......... 355/53, 67, 71; 425/171, 375; 362/236
See application file for complete search history.

(56) References Cited

U.S. PATENT DOCUMENTS

| 5,084,714 A | 1/1992 | Beaman |
| 5,274,732 A | 12/1993 | Farnand |

(Continued)

FOREIGN PATENT DOCUMENTS

| EP | 0958912 B1 | 3/2003 |
| EP | 1480080 A1 | 11/2004 |

(Continued)

OTHER PUBLICATIONS

International Search Report for corresponding International Patent Application No. NL2010/050116 mailed Jul. 8, 2010.

*Primary Examiner* — Hung Henry Nguyen
(74) *Attorney, Agent, or Firm* — Swanson & Bratschun, L.L.C.

(57) ABSTRACT

The invention concerns an illumination system for use in a stereolithography apparatus, comprising: a planar support; a multilens projector array mechanically supported on the planar support over the array on a plano side, and having a work surface arranged to receive a resin applying device for applying a resin layer, the projector array comprising a stack of optical elements, including a plurality of lenslets adapted to project the LEDs onto the work surface, and a two-dimensional array of individually controllable light-emitting diodes (LEDs) arranged between the planar support and the multilens projector. According to an aspect, the planar support and the plano side are supported on contact zones arranged over substantially the entire plano side; the illumination system thus forming a rigid body.

16 Claims, 7 Drawing Sheets

(56) References Cited

U.S. PATENT DOCUMENTS

| | | |
|---|---|---|
| 6,391,245 B1 | 5/2002 | Smith |
| 8,142,179 B2 * | 3/2012 | Kihara et al. ............... 425/375 |
| 2002/0164069 A1 | 11/2002 | Nagano |
| 2003/0082487 A1 | 5/2003 | Burgess |
| 2005/0200820 A1 | 9/2005 | Gui |
| 2006/0023192 A1 | 2/2006 | Gui |
| 2006/0098175 A1 | 5/2006 | De Jager |
| 2009/0002669 A1 * | 1/2009 | Liu et al. ..................... 355/67 |
| 2010/0331929 A1 * | 12/2010 | Burrows et al. ............. 607/88 |
| 2012/0057143 A1 | 3/2012 | Jamar |

FOREIGN PATENT DOCUMENTS

| | | |
|---|---|---|
| JP | 2004-148698 | 5/2004 |
| JP | 2005-193638 | 7/2005 |
| TW | 200625027 | 7/2006 |
| WO | WO 2004/013692 | 2/2004 |
| WO | WO 2004/096527 | 11/2004 |
| WO | WO 2006/064363 | 6/2006 |
| WO | WO 2006/074812 | 7/2006 |
| WO | WO 2008/118263 | 10/2008 |

* cited by examiner

ILLUMINATION SYSTEM FOR USE IN A STEREOLITHOGRAPHY APPARATUS

RELATED APPLICATIONS

This application is a 35 U.S.C. §371 national phase application of PCT/NL2010/050116 (WO 2010/101466), filed on Mar. 8, 2010, entitled "Illumination System for Use in a Stereolithography Apparatus", which application claims priority to European Application No. 09154568.1, filed Mar. 6, 2009, which is incorporated herein by reference in its entirety.

The invention relates to the field of stereolithography, and more in particular to an illumination system for use in a stereolithography apparatus.

Stereolithography, also known as 3D-printing, is a rapid prototyping technology for producing parts with high accuracy. In a simple implementation stereolithography may utilize a vat of liquid light-curable photopolymer resin and a computer controlled UV-laser to cure the resin, one layer at a time. The construction process is essentially cyclic. For each layer that corresponds to a slice of the part to be produced, the spot of the laser beam traces the respective cross-sectional pattern on the surface of the liquid resin. Exposure to the laser light cures or solidifies the traced pattern, and adheres it to the layer below. Once a layer has been cured, the part in the making—which may rest on an elevator platform immersed in the vat of photopolymer resin—may be lowered by a single layer thickness such that its top layer is positioned just below the surface of the resin again, allowing the next layer to be built. This sequence of steps is continued until the part is finished.

Instead of with a laser, the stereolithography apparatus may be fitted with an illumination system comprising two-dimensional arrays of LEDs and lenses to provide for selective illumination of the photopolymer resin. The illumination system as a whole may be moveably disposed relative to the location of the workpiece, while the LED's may be rigidly connected to one another and the lenses. The lenses may serve to image the light-emitting surfaces of the LEDs onto the surface of the photopolymer resin. Preferably, each LED is associated with its own conjugate image spot, such that an array comprising a certain number of LEDs may produce just as many image spots. During production of the workpiece, the illumination system may be scanningly moved relative to the vat holding the photopolymer resin, while the individual LEDs may be selectively switched on and off so as to illuminate the surface of the resin according to the cross-sectional pattern of the layer to be solidified. Compared to a laser, an illumination system based on LED lighting is relatively inexpensive. In addition, it offers an equally high or higher accuracy at greater production speeds.

To manufacture a suitable illumination system in an economical fashion is challenging. One of the challenges is lying in providing an optical system that transmits sufficient power. The higher the optical power that is transmitted by the system, the faster the stereolithographic process can be performed. However, given the wide-angle nature of LED's it is a challenge to couple the LED light into the optical system.

It is an object of the present invention to provide for an economical solution that overcomes or alleviates one or more of the above-described problems associated with the state of the art.

To this end, the invention provides an illumination system 30 for use in a stereolithography apparatus 1, comprising: a planar support 31; a multilens projector array 40 mechanically supported on the planar support 31 over the array 32 on a plano side 46, and having a work surface 451 arranged to receive a resin layer 16, the projector array 40 comprising a stack of optical elements, including a plurality of lenslets 44 adapted to project the LEDs onto the work surface 451, and a two-dimensional array 32 of individually controllable light-emitting diodes LEDs 34 arranged between the planar support 31 and the multilens projector 40. According to an aspect, the planar support 31 supports or is connected to the plano side 46 through or via contact zones 33, 400 arranged over substantially the entire plano side 46; the illumination system thus forming a rigid body 30.

In the drawings, identical reference numbers identify similar elements. The sizes, shapes, relative positions and angles of elements in the drawings are not necessarily drawn to scale, and some of these elements may be arbitrarily enlarged and positioned to improve drawing legibility. Further, the particular shapes of the elements as drawn are not intended to convey any information regarding the actual shape of the particular elements, and may have been solely selected for ease of recognition in the drawings.

DETAILED DESCRIPTION

A known illumination system is the one described in WO2006/064363 where the light of multiple light sources (LEDs) is collimated by a multi lens array to provide an essentially uniform illumination on a substrate. The outgoing beams are slightly diverging, so that the outgoing beams have a certain overlap on the substrate. A film mask is provided on top of the substrate for patterning purposes. A similar illumination system is known from US2009/0002669A1. In contrast to these prior art structures, reference is first made to FIG. 1, which shows a sectional side view of an exemplary stereolithography apparatus 1 according to an aspect of the invention. The apparatus 1 may be used for the layerwise production of a tangible object 2, such as a prototype or model of an article of manufacture. The apparatus 1 may comprise a carrier plate 4, a liquid reservoir 10, and an illumination system 30.

Figure 1:
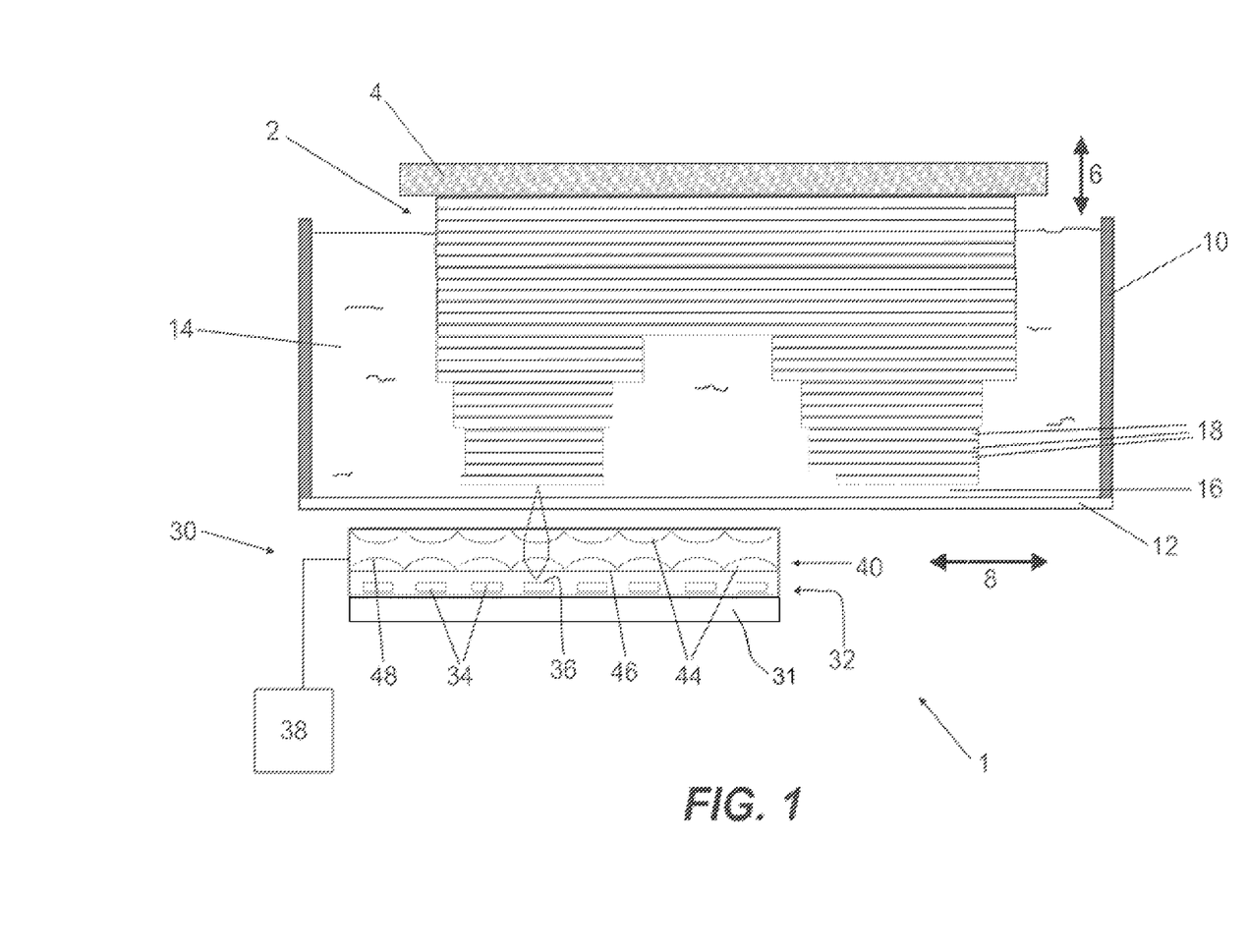
FIG. 1 is a schematic sectional view of an exemplary stereolithography apparatus in which the illumination system according to the present invention may be used.

During production, the tangible object 2 is suspended from the carrier plate 4 to which the first-constructed layer of the object 2, and indirectly also any subsequent layers, adhere. The carrier plate 4 is moveable in a direction 6 by means of a drive mechanism (not shown), and is moved upward one layer thickness each time a new layer has been constructed.

The liquid reservoir 10 may be filled with a liquid, photo-curable resin 14. A bottom plate 12 of the liquid reservoir 10 is optically transparent to the light emitted by the illumination system 30, which is to be described hereafter. The bottom plate 12 also functions as a construction shape that bounds one side of a liquid layer 16 to be (partially) solidified. It will be clear that once a layer has been constructed, and the carrier plate 4 is moved upward one layer thickness, the space between the lastly constructed layer and the bottom plate 12 is filled with resin 14, so as to form said liquid layer 16.

The apparatus 1 also comprises an illumination system 30 that is adapted to selectively illuminate a predetermined area of the liquid layer 16. As a result of the illumination, a solid layer 18 of the tangible object 2 may be obtained, said layer 18 having a predetermined shape in accordance with the applied illumination pattern. The illumination system 30 includes an LED array 32 provided on a support 31 and an imaging system that comprises a multi-lens projector 40. In other embodiments, the imaging system may comprise a different number of multi-lens arrays, for example just one, and/or other elements, depending on the desired configuration. In a preferred embodiment, the number of lenslets in a multi-lens array is approximately 10.000 to 25.000 or more.

The LED array 32 comprises a plurality of LEDs 34. The LEDs 34 are arranged in a two dimensional plane, preferably in a grid-like fashion, such that the LEDs compose equidistant and perpendicularly oriented rows and columns with each LED defining a gridpoint. Each of the LEDs 34 possesses a light-emitting surface 36 that faces the bottom plate 12 of the liquid reservoir 10, which is substantially parallel to the two-dimensional plane of the LED array 32. A controller 38 may be provided to control, i.e. switch off and on (with desired intensity), individual LEDs 34 in the array 32 so as to create a time-varying two-dimensional pattern of lighted LEDs that may be projected onto the liquid resin layer 16.

The substantially planar multi-lens projector 40 is disposed in between the light-emitting surfaces 36 of the LEDs 34 and the liquid layer 16 to be selectively cured. The projector 40 comprises a plurality of lenses or lenslets 44, preferably one for each LED 34. The lenses 44 may preferably be arranged in correspondence with the arrangement of the LEDs 34 in the array 32. The multi-lens projector 40 may be of a plano-convex type, thus having one plano side 46 that defines the plano side of all lenses 44, and a plurality of convex, partially spheroidally shaped sections 48, one for each lens 44. The lenslets 44 may be oppositely oriented, as shown in FIG. 1. Together, the multi-lens projector 40 forms an imaging system that is adapted to image a pattern of lighted LEDs onto the liquid layer 16 in such a way, that each lighted LED 34 produces a separate, conjugate spot on a predetermined area of the liquid layer 16. The multi-lens projector 40 may be made of a variety of materials, including glass and plastic.

The illumination system 30 may be moveably disposed below the bottom plate 12 of the liquid reservoir 10, such that it can move in a direction 8 parallel to the bottom plate 12 of the liquid reservoir 10. The motion of the illumination system 30 may be controlled by the aforementioned controller 38, which also may control the lighting of the LEDs 34. In an embodiment, separate controllers control the motion of illumination system and the lighting of the LEDs. In use, the illumination system 30 may be moved rectilinearly in a direction that extends at an angle with the perpendicular directions of the rows and columns of the LED array 32 to enhance the effective resolution of the system. This technique is described in more detail in copending application EP 07150447.6 in the name of applicant, which is incorporated herein by reference for further information regarding this aspect. Accordingly, in FIG. 1, an illumination system (30) for use in a stereolithography apparatus (1) is shown, comprising: a planar support 31 supporting a two-dimensional array of individually controllable wide-angle light-emitting diodes (LEDs) (34) comprising light emitting surfaces; and a multilens projector array (40) arranged relative to the array, and adapted to project the light-emitting surfaces of the LEDs onto a work area (16). The light emitting surfaces may be defined by a LED-substrate surface or, equivalently, a planar mask placed adjacent to the LED-substrate, so that a focussed image of the LEDS is provided onto the work area (16).

A typical width dimension of the Led array and multilens array is approximately 50×5 cm, to be able to project a scan image on a work area of approximately 500×500 mm. However, the invention is not limited to such dimensions. Other typical numbers are a projector pixel number of approximately 10.000 to 25.000 or more, pixels placed in a grid distance of approximately 2 mm and slightly placed under an angle to form a resolution of approximately 20 micrometer. (curing layer thicknesses of typically approximately 50 micrometer). Attainable production speeds of tangible objects 2 could be typically approximately 20 millimeters per hour or more.

The light is typically UV light in an approximately 300 nm area, in particular, in a 300-400 nm range.

Figure 2:
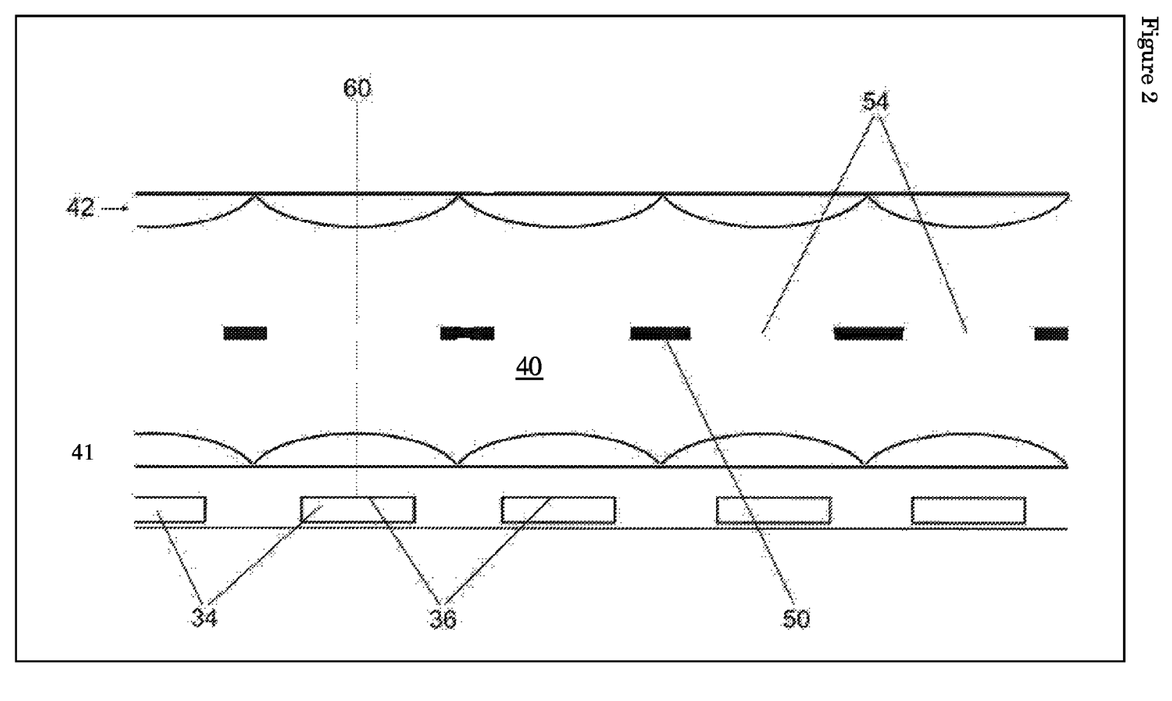
FIG. 2 illustrates a projector embodiment including a mask structure.

In the exemplary embodiment shown in FIG. 2, an optical mask 50 is provided in between the two multi-lens arrays 41, 42. The mask 50 essentially functions as an aperture stop that blocks light coming from angles of the light-emitting surface 36 of an LED 34 that are larger than the numerical aperture angle. Although in the FIG. 2 and FIG. 3 embodiments the optical mask 50 is structured as a separate plate-like object alternatively, the optical mask 50 may be provided by for example printing or vapour deposition.

Although the optical mask may be disposed at different positions in the illumination system, as will be elucidated below, the optical mask is preferably disposed in a Fourier plane. At such a position the mask may prevent any undesired light from entering the imaging system, in which it might disperse, making it harder to eliminate at a later stage. For a given optical mask and LED array, a suitable position between the light-emitting surfaces of the LEDs and the image plane should therefore allow the mask to serve as an aperture stop, or in fact a plurality of aperture stops, one for each light-emitting surface. Particularly advantageous is the application of an optical mask to a light-receiving face, in particular a plano face, of a multi-lens array that is part of the imaging system. The optical mask may for example take the form of a film or a coating. A plano side allows the optical mask to be applied easily, whereas application to the multi-lens array does away with the necessity to align a separate optical mask relative to the multi-lens array during assembly of the illumination system. The above-mentioned and other features and advantages of the invention will be more fully understood from the following detailed description of certain embodiments of the invention, taken together with the accompanying drawings that are meant to illustrate and not to limit the invention.

Figure 3:
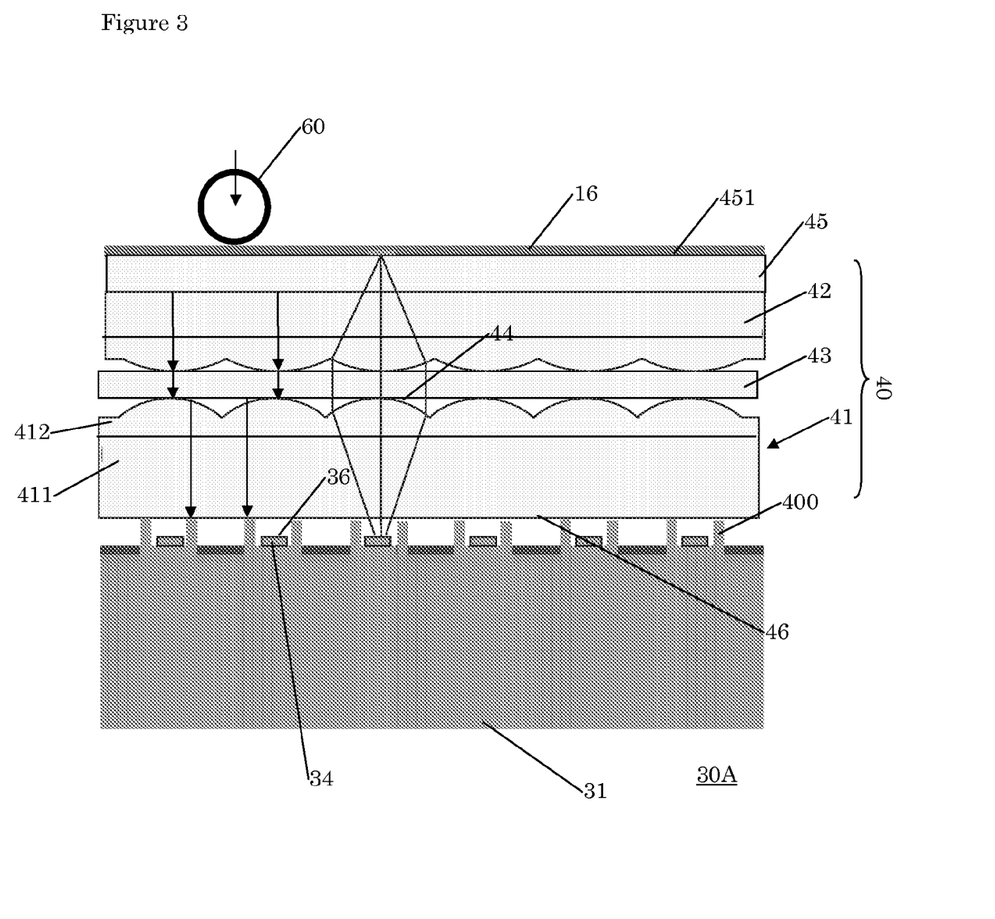
FIG. 3-FIG. 6 schematically illustrate certain embodiments of an illumination system according to the present invention.
Figure 4:
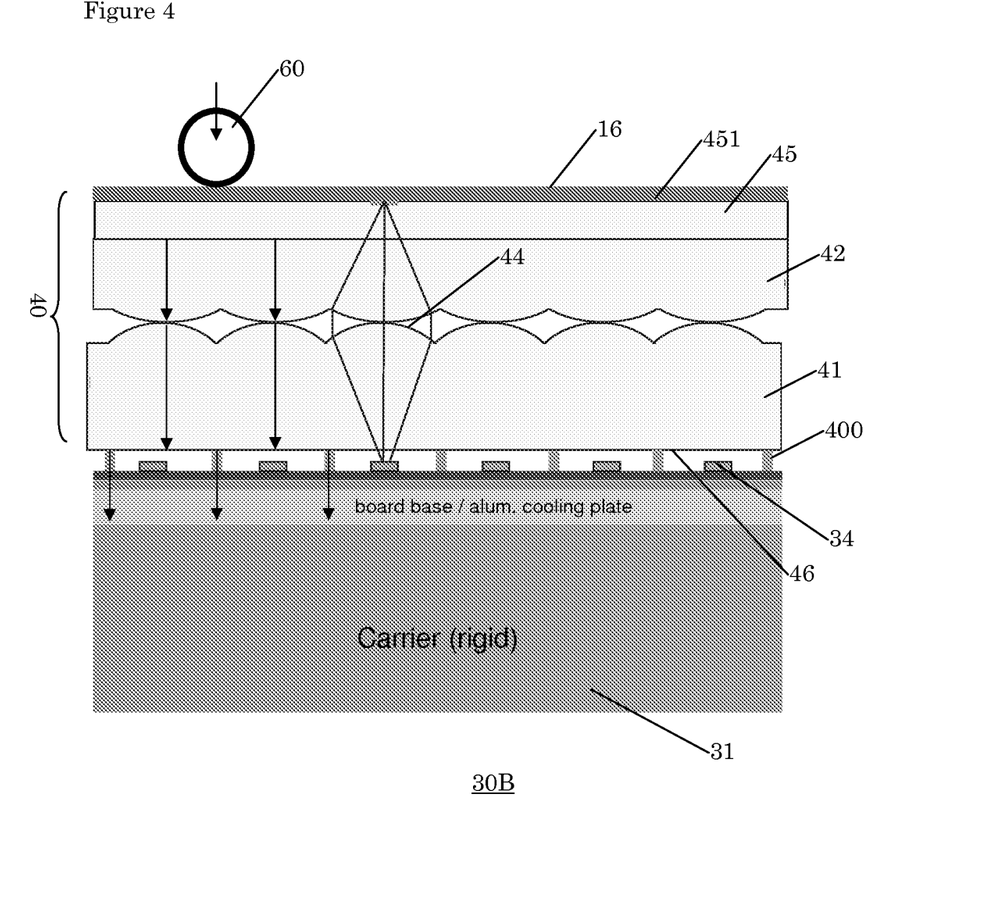

In FIG. 3 and FIG. 4, embodiments are shown of an illumination system 30 wherein the lenslets (44) are arranged in direct abutment on a lenslet convex side with another optical element (43) in the stack. In particular, multilens projector array (40) is formed by a stack of optical elements 41, 42, 43, 45, including a plurality of lenslets 44 in the form of a lenslet body 41, 42, in direct abutment on a lenslet convex side with another optical element 42, 43 in the stack.

Accordingly an illumination system 30 is provided for use in a stereolithography apparatus 1, comprising a planar support supporting a two-dimensional array 32 of individually controllable wide-angle light-emitting diodes (LEDs) 34; and a multilens projector array 40 arranged relative to the array, and adapted to project the LEDs onto a work area 16; wherein the multilens projector array 40 comprises a stack of optical elements including a plurality of lenslets in direct abutment on a lenslet convex side with at least another optical element in the stack.

In particular, in these embodiments the multilens projector array (40) comprises lenslet bodies 41, 42 each formed as a plano-convex multilens array; wherein at least one convex side of a lenslet body 41 or 42 is in direct abutment on contact zones 44 arranged over substantially the entire body surface with another element of the stack (piano 43 in FIG. 3).

In FIG. 4 this other optical element is formed by lenslet body 42 arranged with opposed convex sides in direct abutment; the projector 40 thus forming an essentially rigid body supported by the planar support 31. In FIG. 3 spacers may be provided as protruding ridges 400 cast integral in support 31, and in direct contact with the plano side 46 of the lenslet body 41.

A difference between the two embodiments is the presence (FIG. 3) or absence (FIG. 4) of a plano body 43 between the two multilens arrays 41, 42. Both embodiments have the advantage that a rigid structure is provided that is easy to implement, and has high structural tolerance. In particular, the support 31 is a rigid support, for example, of an aluminium plate and comprises, for example further cooling structures such as coolant channels or heat fins to form a heat sink for the LEDS. By this structural assembly, forces exerted to the planar surface, for example, by a resin applying device 60 applying resin layer 16, can be led through to a rigid support 31.

Such a resin applying device 60 may be a resin foil guide, which may be arranged to provide a resin foil in moving contact with the work area 16, which typically exerts a pressure onto the projector body 40 and which is addressed in order to enhance properly patterned illumination by the LED arrays 32. Pressing forces onto the projector 40 may be provided by a variety of other sources, including acceleration forces etc. An exemplary embodiment of such device 60 is disclosed by the stereolithographic apparatus of FIG. 7.

Although in principle, optical arrangements demand strict dimensional tolerances; due to the nature of stereolithographic curing, the imaged pixel area in the curing layer may not be identical to the imaged LED light emitting surface 36; which relaxes the constraint of in-focus imaging. In particular, in an embodiment, the stacked lenslet bodies 41, 42 are formed with opposed convex sides in direct abutment on contact zones arranged over substantially the entire body surface; so as to form a flat rigid projector body 40. Here, remarkably, a slight flattening tolerance is allowed of the convex lenslets 44 that are in direct abutment, since near the optical axis, the image of the LEDS can be projected without optical power. This confirms the inventive principle, that the pixel area in the curing layer may not be identical to the imaged LED light emitting surface 36; which relaxes the constraint of in focus imaging. The flattening, due to shortening of the lenslet along the optical axis may be roughly one half of the LED light emitting surface diameter. This flattening may be predesigned to increase the geometrical stability of the projector body 40 and to ease the assembly of the lenslet bodies 41. In addition, the lenslets may be of a Fresnel type, wherein annular lens portions may be provided. The inner lens portion may be flat or at least flattened. Such lenslet arrangements may be used to further decrease a height dimension and/or stabilize the lens projector body 40.

FIG. 3 and FIG. 4 accordingly illustrate that the projector stack 40 is in direct abutment on contact zones 400 arranged over substantially the entire surface with the projector support 31 of illumination system 30. Here, abutment over contact zones 400 arranged over substantially the entire surface is meant to encompass configurations with isolated supports, such as depicted in the FIG. 3 and FIG. 4, as long as the sagging of the support is minimal in view of a pressing force exerted on the projector stack surface 451.

In an embodiment, typically a support point 400 may be provided per light channel, or one support point for every 2×2 light channels, or for every 5×5, 10×10 etc. light channels. In addition, the entire element surface may be supported, for instance protective plate 45 is supported over its full area by lenslet body 42.

Accordingly, preferably each constituting element of illumination system 30A, 30B is supported by one of the lower elements in the stack, typically by a support structure immediately beneath the layer itself in direct abutment on at least one—for a structure supporting the entire surface, such as, in an embodiment, a transparent layer such as plano 46 or resin layer 33, see herebelow, or on many contact zones arranged over substantially the entire element surface.

The supports may be formed by bare LED dies 34. This may have an additional advantage of accurate Z-alignment of the dies by forming a flat levelling contact with the plano side 46 of the projector stack 40.

In all, preferably the disclosed embodiments are formed by a rigid stack defining compact and rigid illumination systems, such as those disclosed in 30A-F. The system 30 includes (from bottom to top) an electronics board 311 (printed circuit board, possibly flexible), optionally itself comprised of a number of layers of different materials and the projector 40 formed by a stack of optical elements. The mechanical link between the carrier 31 and the next higher layer may be e.g. a set of ribs 400 protruding upward from the carrier 31. Alternatively individual blocks (each having a flat top and bottom), or a plate with holes to leave space for the light sources (LEDs) may be provided (not shown).

The projector body 40 then is formed by a lower lens array 41, typically comprised of a plano side formed by a transparent, e.g. glass plate 46. a layer 412 of lenslets 44, for example of a transparent plastic, and typically having a flat bottom side in contact with the glass plate 46 and on the top side a multitude of convex lens surfaces 44.

In addition a support plate 45, e.g. of glass material and a protection film (not shown) can be provided typically defining a very short, almost zero working distance on working area 16. It is noted that this can be conveniently combined with the large NA working principle according to the invention demanding short, preferably (almost) zero working distances.

An advantage of the plano body 43 in FIG. 3 is that the X-Y alignment of the convex shaped lenslets bodies 41 42 is easier to control. In addition, a transparent top plano 45 may be attached to the multilens arrays to facilitate replacement of a work surface. While FIG. 3 shows spacers 400 as integrated elements of the support, a separate platelike structure could be provided as in FIG. 4. This structure could also serve as an aperture defining mask structure according to the inventive principle.

Figure 5:
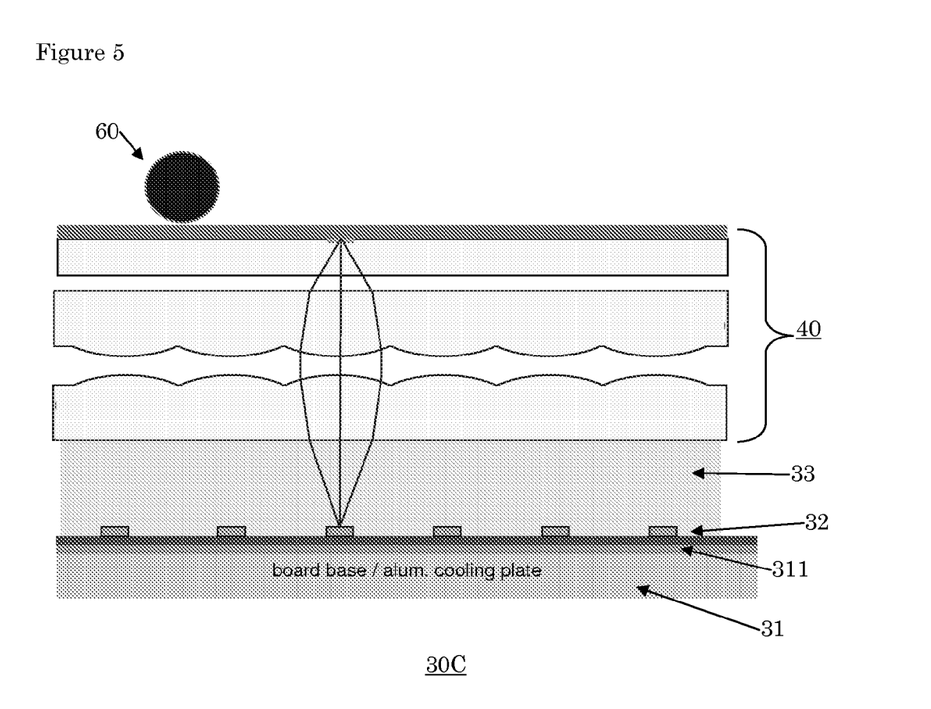

In another embodiment, illustrated in FIG. 5 alternatively, a resin layer 33 forming a reinforcement layer between the carrier 31 including the LED array 32, may be provided. The resin 33 may improve the structural stability of the support since sagging of the plano 46 between supports 400 (as depicted in FIG. 3) can be prevented. At the same time optical transmission between the LEDs 34 and the projector 40 can be enhanced. Furthermore, a sealing edge around the projector body may be reduced in size or altogether omitted, reducing the projector mass and size. Typically, the resin has a refractive index of around 1.3 or larger, for example, 1.5 and can be photo-curable silicone resin. While the resin may be of a curable type, additionally or alternatively, an optical transmission fluid may be provided, even in other parts of the stack, for example between lenslet arrays 41, 42, to improve the optical transmission and further improve the structural stability of the stack. This can for example be done by stacking, sealing and filling the stack with optical transmission fluid of a desired refractive index, and possibly curing the fluid. The LED material is typically a AlGaN having a refractive index of around 2.5. To optimize the transmission the resin does not have to be a continuous layer but may be applied in blobs, as long as each LED is covered, and the space between the LED and the optical part above it is filled. Suitable resin materials are transparent for the radiation used, which in an embodiment may be UV radiation around 365 nm. The material preferably has a refractive index higher than 1.3 which provides optical design latitude, in practice a value between the refractive index of the LED material and the refractive index of the plano 46. In a practical embodiment, a resin commercially obtainable under the trade name Sylgard 184 with refractive index n=about 1.55 was used. Other material choices may be for example acrylate, polycarbonate.

Without said optical immersion by the resin layer 33, transmission losses between the LED outcoupling and the projector incoupling may involve about 22%, where the addition of the resin layer may improve the transmission to a loss of only about 7%. Accordingly, an optical power transmission improvement of about 20% can be provided. Conveniently, the resin is of a photo-curable type, which can be cured by use of LEDS 34. In an embodiment, additionally, rigid spacers (not shown) are provided in the curable resin to improve the structural stability. The spacers may be removed after curing. Alternatively, the spacers are formed by the LED surfaces where only a thin film of resin may form a power transmission interface. Conveniently, the resin protects the mechanical integrity of the LED-bondings, in particular, the electrical circuit bonds.

Figure 6:
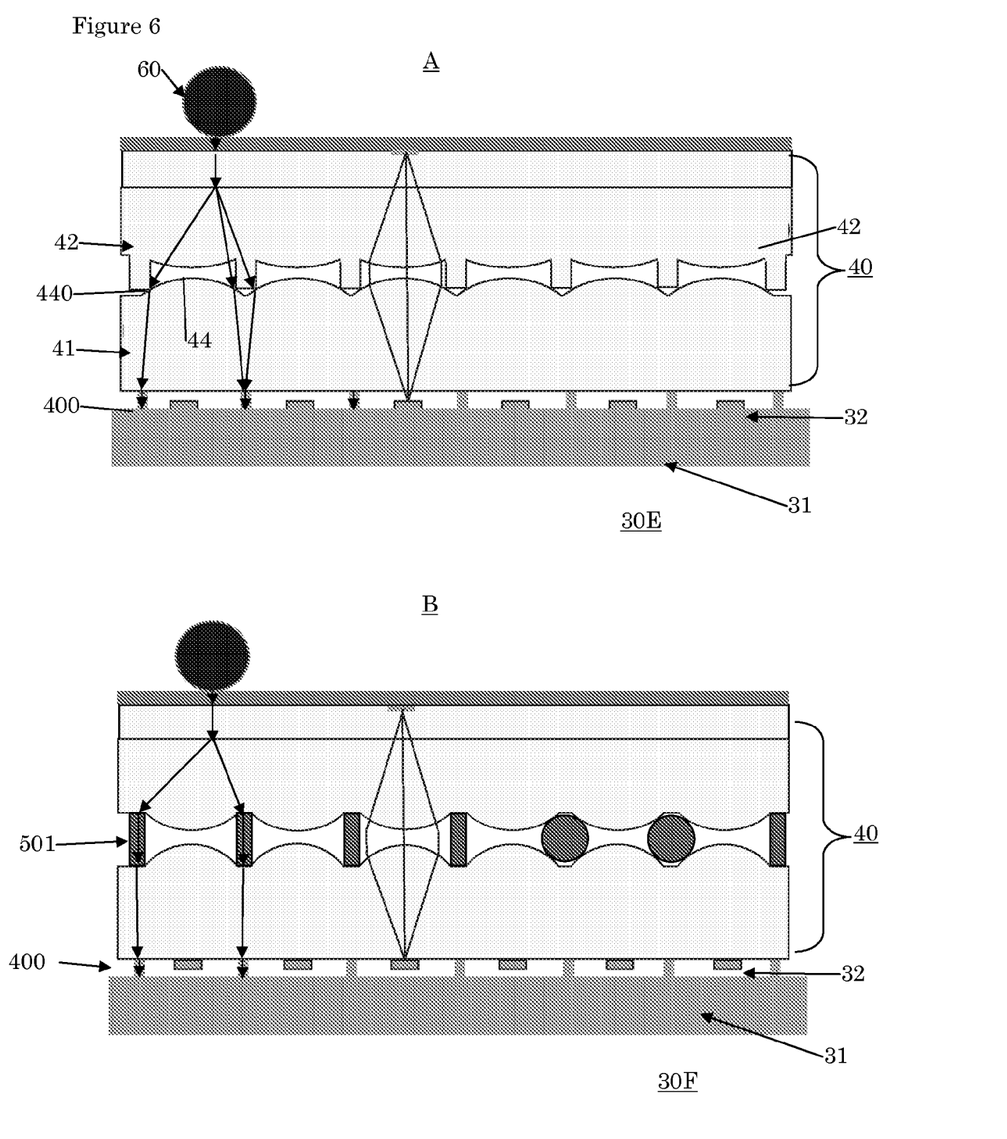

In another embodiment 30E, illustrated in FIG. 6A, supports can be embodied as protrusions 440 moulded on concave sides between the convex optical surfaces 44 of lens layer 42 or as an intermediate supporting layer 501 in illumination system 30F (FIG. 6 B). Alternatively the supporting layer may be formed by a number of isolated supports, e.g. balls, but preferably, the layer is formed by an integral perforated plate 501 formed with perforations for the optical paths. Conveniently, anti-straylight mask 50 of FIG. 2 can be used for such purpose.

The orientation of the illumination device 30 may well be inversed to have the LEDs arranged on a top plano surface and a working area arranged on a bottom side.

Alternatively as shown in FIG. 6B the array 32 of light-emitting diodes (LEDs) 34 may be arranged with bare dies aligned in contact with the plano side 46 while having electrical contact from a circuit board (not shown) arranged on the support 31.

Additionally, preferably the multilens projector array is arranged to project light from angles larger than a focused numerical aperture angle in a conventional optical design. Here, the focused numerical aperture angle is defined as the maximum entry angle of the outermost ray into the projection optical system that can be imaged in focus. More specifically, said multilens projector array is arranged to project light from the LED array emitted from angles larger than a maximum entry angle of an outermost ray entering the projector array that can be imaged in focus. Here the entry angle is measured relative to an optical axis or normal direction of the projector array. Thus, the "focused numerical aperture" value (FNA), is defined as n*sin(thetaf) where thetaf is the angle of the outermost ray that is well focused by the system. One further definition of focus may be that a ray is imaged within approximately 5 um, preferably within approximately 2 um from the image of a central ray. Normally, in a design of an optical system the maximum entry angle is chosen to be not larger than the focused numerical aperture. A well-known characterization of a numerical aperture is NA=n sin θ wherein θ defines a maximum entry angle of light into the projector system (irrespective of it's focussing behaviour); and n is the refractive index of the projector. A typical numerical aperture value of a projector system is 0,2. In one characterization, the numerical aperture of the projector system according to an aspect of the invention is at least approximately 0,3 —to values ranging to 0, 8 or even above 0,8.

The solution offered by the present invention is based on the understanding that depending on the lens design, one can distinguish a FNA value for points in the central area of the emitting surface and for points in the edge area of the emitting surface. The inventors found, that for the effective total spot quality the FNA of the edge area points is most important, and that the optical design of the lens system can be made or changed to provide large FNA for edge area points while allowing the FNA for central area points to be reduced.

Accordingly, the multilens projector array preferably utilizes a larger numerical aperture than would be conventionally feasible, in particular, with a lens arrangement of no more than two lens stacks, by relaxing the focussing quality of the projector array in a specific way. This is preferably obtained by designing the optical surfaces such, that the image quality is only corrected at the outer edges of the LED image in the resin. According to one characterization, the focusing quality of the outer edge parts of the LED image is at least equal or even better than the focusing quality of the central parts. As an example, in a typical projector setup, a central point of the LED may be imaged in a region of about 30 micron diameter, for example, in a region extending between about 25 and 40 micron; wherein a peripheral point of the LED may be imaged in a region of about 20 micron diameter, for example, in a region extending between 10 and 25 micron; illustrating a focusing quality of the edges which is about a factor 1.5 better than the focussing quality in the central parts. Typically, the focusing quality of the edge areas is at least equal to the focusing quality of the central area.

Furthermore, the image quality criterion used may be more relaxed than conventionally expected, because advantage is taken from the thresholding behaviour of the resin.

Figure 7:
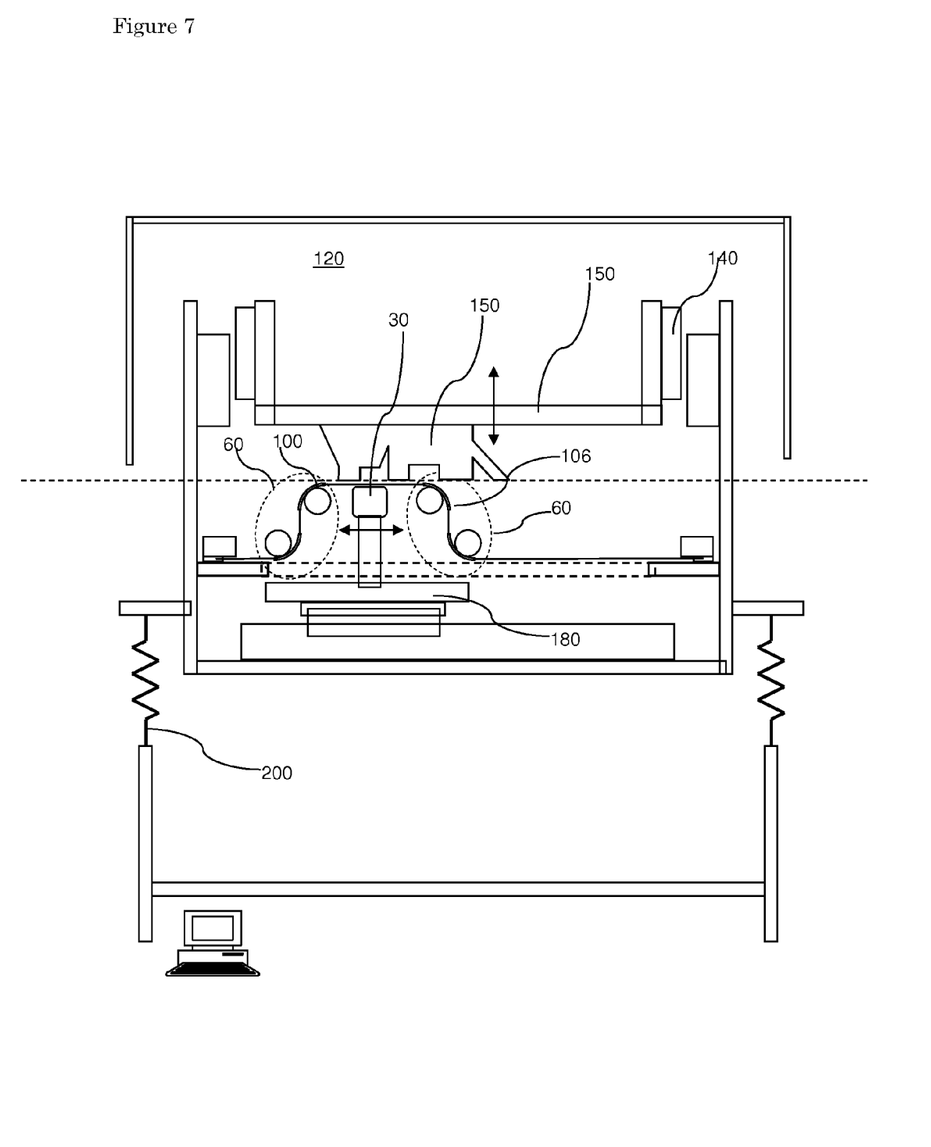
FIG. 7 shows another embodiment of a stereolithography apparatus.

FIG. 7 shows a further embodiment of a resin applying device 60 arranged to provide a resin foil in moving contact with the work area 16, which typically exerts a pressure onto the projector body 40 and which is addressed in order to enhance properly patterned illumination by the LED arrays 32.

The system 120 is disclosed in application PCT/NL2009/050783, herein incorporated by reference, and comprises a construction shape in the form of a flexible foil 106. On the foil 106, a liquid layer 100 is formed of limited height to be brought in contact with the tangible object 150. The presently disclosed illuminator embodiments 30 are arranged, by suitable control of the LED array, to solidifying a predetermined area of a layer of the liquid 100, said liquid layer 100 adjoining the foil 106, so as to obtain a solid layer of the tangible object 150, the solid layer thus having a predetermined shape.

To enable the light or other radiation of the illuminator 39 to solidify the liquid layer 100, the flexible foil 106 is preferably substantially transparent to the radiation at least having film 106 clear on only one side and optionally matte or clear on another side.

In the embodiment a movable foil guiding stage 180 is located below the construction shape 150. Further, in the shown example embodiment, the illuminator 30 is positioned on the movable foil guiding stage 180, between foil guiding elements 60, to expose the layer of uncured material through the foil 106.

In the embodiment, each time after solidification and separation of a new layer, carrier plate (z-stage) 15 together with the tangible object 5 including solidified layers adhered thereon are moved upwards. Hence, the method for layerwise production of a tangible object is a cyclic method, wherein the described steps of positioning, solidifying, and separating together are comprised in a single cycle step of the method.

In the shown example, the foil 6 is transparent to radiation from illuminator 30. Movable z-stage 140 can be moved in a z-direction before a new layer of curable material is provided to the tangible object 150.

The foil 106 can be arranged for carrying the curable layer material 10 supplied from a dispenser (not shown) to the tangible object 150 and for carrying the removed uncured material away from the tangible object 150.

In one embodiment, for each layer two process steps are always required providing a layer of resin on foil 106, exposure of the resin; in many applications there is also releasing the unexposed resin from the building surface ('peeling' in the example of the drawing).

The system 120 can be provided with vibration damping 200 and a protective cap. A controller can be arranged to control the method steps carried out by the system 120.

Although illustrative embodiments of the present invention have been described with reference to the accompanying drawings, it is to be understood that the invention is not limited to these embodiments. While certain embodiments detail certain optional features as further aspects of the invention, the description is meant to encompass and specifically disclose all combinations of these features unless specifically indicated otherwise or physically impossible. Various changes or modifications may be effected by one skilled in the art without departing from the scope or the spirit of the invention as defined in the claims.

The invention claimed is:

1. An illumination system for use in a stereolithography apparatus, comprising:
   a planar support;
   a two-dimensional array of individually controllable light-emitting diodes (LEDs) arranged between the planar support and a multilens projector array;
   the multilens projector array being mechanically supported on the planar support over the two dimensional array on a plano side, and having a work surface arranged to receive a resin layer on the work surface, the projector array comprising a stack of optical elements, including a plurality of lenslets adapted to project the LEDs onto the resin layer, and
   wherein the planar support and the plano side are supported on contact zones arranged over substantially the entire plano side, the illumination system thus forming a rigid body.

2. The illumination system according to claim 1, wherein the contact zones are provided as a plurality of protrusions, integrally cast in the rigid support.

3. The illumination system according to claim 1, wherein the contact zones are provided by the LEDs.

4. The illumination system according to claim 1, wherein the contact zones are provided by a perforated plate structure.

5. The illumination system according to claim 1, wherein the contact zones are formed by a transparent resin layer immersing the LEDs.

6. The illumination system according to claim 1, wherein the lenslet numerical aperture is larger than 0.3.

7. The illumination system according to claim 1, wherein the lenslets are arranged in direct abutment on a lenslet convex side with another optical element in the stack.

8. The illumination system according to claim 7, wherein the plurality of lenslets is formed as a plano-convex multilenslet body; wherein at least one convex side of the multilenslet body is in direct abutment on contact zones arranged over substantially the entire body surface.

9. The illumination system according to claim 7, wherein the another optical element in the stack is formed by a plano or by another lenslet body arranged with opposed convex sides in direct abutment on contact zones arranged over substantially the entire body surface.

10. The illumination system according to claim 1, wherein an optical mask is deposited onto a plano side of the lenslet body.

11. The illumination system according to claim 1, wherein an optical mask is provided as a separate plate-like object.

12. The illumination system according to claim 1, wherein the projector system comprises:
   a first multi-lens array;
   a second multi-lens array, and
   wherein an optical mask is disposed in between the first and second multi-lens arrays.

13. The illumination system according to claim 12, wherein the optical mask is formed with perforations for the optical paths for supporting the multi-lens array on contact zones arranged over substantially the entire multi-lens array surface.

14. The illumination system according to claim 12, wherein a number of isolated supports is arranged over substantially the entire multi-lens array surface.

15. The illumination system according to claim 1, wherein the plurality of lenslets is formed as a plano-convex multilenslet body having supporting protrusions moulded on concave sides between the convex optical surfaces of lens layer for supporting the multilenslet body on contact zones arranged over substantially the entire body surface.

16. An illumination system according to claim 1, wherein the LEDs are arranged in equidistant and perpendicular rows and columns.

* * * * *